(12) United States Patent
Ryu et al.

(10) Patent No.: US 8,801,486 B2
(45) Date of Patent: Aug. 12, 2014

(54) METHOD OF MANUFACTURING ORGANIC LIGHT EMITTING DISPLAY DEVICE

(75) Inventors: Ji-Hun Ryu, Yongin (KR); Seung-Yong Song, Yongin (KR); Young-Seo Choi, Yongin (KR); Oh-June Kwon, Yongin (KR); Kwan-Hee Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 816 days.

(21) Appl. No.: 12/830,556

(22) Filed: Jul. 6, 2010

(65) Prior Publication Data

US 2011/0183575 A1 Jul. 28, 2011

(30) Foreign Application Priority Data

Jan. 22, 2010 (KR) .................. 10-2010-0006050

(51) Int. Cl.
*H01J 9/26* (2006.01)

(52) U.S. Cl.
USPC ............................................. 445/25

(58) Field of Classification Search
USPC ..................................... 445/24–25
See application file for complete search history.

(56) References Cited

U.S. PATENT DOCUMENTS

| 7,659,663 B2 | 2/2010 | Kwak |
| 2003/0122476 A1 | 7/2003 | Wang et al. |
| 2009/0058294 A1 | 3/2009 | Joo et al. |
| 2009/0195147 A1 | 8/2009 | Song et al. |
| 2010/0072482 A1* | 3/2010 | Eom et al. ................ 257/72 |

FOREIGN PATENT DOCUMENTS

| JP | 2003203763 A | 7/2003 |
| JP | 200619031 A | 1/2006 |
| KR | 100645716 B | 11/2006 |
| KR | 100840117 B | 6/2008 |

OTHER PUBLICATIONS

Korean Office action issued by Korean Industrial Property Office on Apr. 26, 2011, corresponding to Korean Patent Application No. 10-2010-0006050 and Request for Entry of the Accompanying Office Action attached herewith.
Korean Registration Determination Certificate issued by KIPO on Jan. 16, 2012 corresponding to KR Application No. 10-2010-0006050 and Request for Entry attached here with.

* cited by examiner

*Primary Examiner* — Anh Mai
*Assistant Examiner* — Brenitra M Lee
(74) *Attorney, Agent, or Firm* — Robert E. Bushnell, Esq.

(57) ABSTRACT

A method of fast and effective manufacturing of an organic light emitting display device includes: forming at least one closed loop on a first surface of a first substrate by using a sealing member; coating an area defined by the closed loop on the first surface of the first substrate with a filler so that at least a part of an end portion of the coated filler does not contact the sealing member; preparing a second substrate comprising at least one organic emission unit formed on a second surface of the second substrate; disposing the second substrate opposite to the first substrate so that the organic emission unit faces the first surface of the first substrate; coupling the first substrate with the second substrate by using the sealing member; and allowing the entire end portion of the filler to contact the sealing member, by using a centrifugal force.

12 Claims, 3 Drawing Sheets

METHOD OF MANUFACTURING ORGANIC LIGHT EMITTING DISPLAY DEVICE

CLAIM OF PRIORITY

This application makes reference to, incorporates the same herein, and claims all benefits accruing under 35 U.S.C. §119 from an application earlier filed in the Korean intellectual Property Office on 22 Jan. 2010 and there duly assigned Serial No. 10-2010-0006050.

BACKGROUND OF THE INVENTION

1. Field of the Invention

The present invention relates to a method of manufacturing an organic light emitting display device, and more particularly, to a method of manufacturing an organic light emitting display device including a filler.

2. Description of the Related Art

Because the organic light emitting display devices have superior characteristics such as wider viewing angles, higher contrast ratios, shorter response time, and lower amounts of power consumption, applications of organic light emitting display devices range from personal portable devices such as MP3 players and mobile phones to television sets.

SUMMARY OF THE INVENTION

It is therefore one aspect for the present invention to provide a method of faster and more effective manufacturing of an organic light emitting display device having improved mechanical reliability and increased durability.

It is another aspect to provide a method of manufacturing an organic light emitting display device, by which penetration of oxygen and moisture may be effectively prevented.

In accordance with an embodiment of the present invention, a method of manufacturing an organic light emitting display device includes steps of forming at least one closed loop on a first surface of a first substrate by using a scaling member; coating an area defined by each closed loop disposed on the first surface of the first substrate with a filler so that at least a part of an end portion of the coated filler does not contact the scaling member; preparing a second substrate comprising at least one organic emission unit formed on a second surface of the second substrate; disposing the second substrate opposite to and spaced apart from the first substrate so that the organic emission unit faces toward the first surface of the first substrate: coupling the first substrate with the second substrate by using the sealing member; and allowing the entire end portion of the filler to contact the scaling member, by using a centrifugal force.

The step of allowing of the entire end portion of the filler to contact the scaling member may include vibrating an assembly of the first and second substrates in a direction parallel to the first substrate.

The step of vibration of the assembly of the first and second substrates may include spinning the assembly of the first and second substrates.

The step of allowing of the entire end portion of the filler to contact the scaling member may include allowing the filler to contact the organic emission unit and the second surface of the second substrate.

After the step of allowing of the entire end portion of the filler to contact the sealing member, the method may further include hardening the filler.

The step of hardening of the filler may include projecting ultraviolet rays onto the filler.

The scaling member may be an inorganic material. The inorganic material may include glass frit.

In accordance with the present invention as described above, a period of time required to inject a filler used to provide impact resistance and to prevent penetration of oxygen and moisture may be significantly reduced, thereby increasing the productivity of organic light emitting display devices.

In addition, filling conditions do not need to be changed too much in order to shorten the period of time required to inject the filler, so that an error rate due to a change in the filling conditions may be advantageously reduced.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings in which exemplary embodiments of the invention are shown.

Performance of the organic light emitting display devices may deteriorate due to penetration of external oxygen or moisture, therefore, a sealing structure for preventing the external oxygen or moisture penetrating an organic light emitting display device is required.

In addition, since the organic light emitting display devices are becoming much thinner, the organic light emitting display devices may be easily damaged by external impacts. Consequently, impact resistance of the organic light emitting display devices needs to be increased.

If the thickness of a substrate is reduced to 0.3 mm or less in order to decrease the total thickness of an organic light emitting display device, obtaining mechanical reliability as a result of a test such as a drop test, a twisting test, or the like may be difficult. A decrease in mechanical reliability may cause a sealed state of the organic light emitting display device to be destroyed, and may lead to a decrease in the durability of the organic light emitting display devices.

FIGS. 1 through 6 are cross-sectional views showing a method of manufacturing an organic light emitting display device, in accordance with an embodiment of the present invention.

Figure 1:
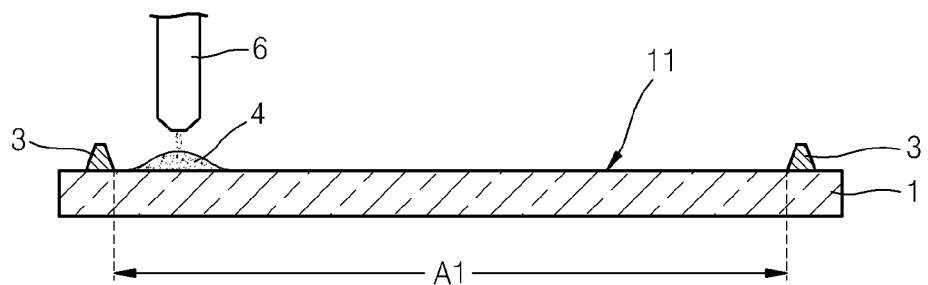
FIG. 1 is a cross-sectional view showing an operation of coating a filler on a first substrate.

First, as illustrated in FIG. 1, a sealing member 3 is disposed on one surface 11 of a first substrate 1.

The first substrate 1 may be a glass substrate, however, the present invention is not limited thereto. The first substrate 1 may be a substrate including metal or plastic. As will be described later, the first substrate 1 may be a transparent glass substrate in order to achieve radiation of laser beams or ultraviolet rays (UV).

A closed loop may be formed on the one surface 11 of the first substrate 1 by using the sealing member 3. In FIG. 1, for example, a single closed loop of the scaling member 3 is formed along the edge of the first substrate 1, because, in this exemplary case, the single first substrate 1 forms only a single organic light emitting display device. When the single first substrate 1 forms multiple organic light emitting display devices, multiple closed loops may be formed on the one surface 11 of the first substrate 1. In one embodiment, a single closed loop corresponds to a single organic light emitting display device.

The sealing member 3 may be formed of an inorganic material in order to prevent external atmosphere from penetrating the organic light emitting display device. Glass frit may be used as the inorganic material. In this case, a frit that transmits or reflects laser or infrared rays (IR) may be used as the glass frit. The glass frit may include an absorber, such as iron, copper, vanadium, neodymium, or the like, capable of absorbing an operational wavelength of a laser beam. The glass frit may also include a filler material for harmonizing the thermal expansion coefficients of the first substrate 1 and/or a second substrate 2. Other well-known glass fruits may also be used as the glass frit.

Wan inorganic material, particularly, glass frit, is used to form the scaling member 3, a bonding strength between the first substrate 1 and the second substrate 2 is high, and sealability between the first substrate 1 and the second substrate 2 is high. Thus, penetration of external moisture and oxygen may be effectively prevented.

An organic material, such as epoxy, instead of the inorganic material, may be used to form the scaling member 3.

A filler 4 is coated on an area A1 defined by the scaling member 3 shaped of a closed loop on the one surface 11 of the first substrate 1, by using a dispenser 6. In one embodiment, the area A1 is the inner area enclosed by the sealing member 3 having a shape of a closed loop.

The filler 4 may be formed of a colorless liquid-state or gel-state material having optical transmissivity of 95% or more, when the filler 4 has a thickness of 30 μm or less. Examples of the gel-state material may include epoxy, urethane acrylate, epoxy acrylate, and silicones-based resin (for example, bisphenol A-type epoxy, cycloaliphatic epoxy resin, phenyl silicon resin or rubber, acrylic epoxy resin, aliphatic urethane acrylate, etc.). The gel-state material may be initially filled within the area A1 defined by the sealing member 3 in a liquid state, and the gel-state material filled is then hardened by electron beams or UV or molded into a film or the like so as to be attached to the one surface 11 of the first substrate 1. Examples of the liquid-state material may include silicon or silicon oils having no phase change in a temperature range of −40° C. to +100° C. and having a volume change rate of 5% or less, for example, Hexamethyldisiloxane, Octamethyltrisiloxane, Decamethyltetrasiloxane, Dodecamethylpentasiloxane, and Polydimethylsiloxanes.

The above-described tiller 4 may further include a moisture absorbing material.

Figure 2:
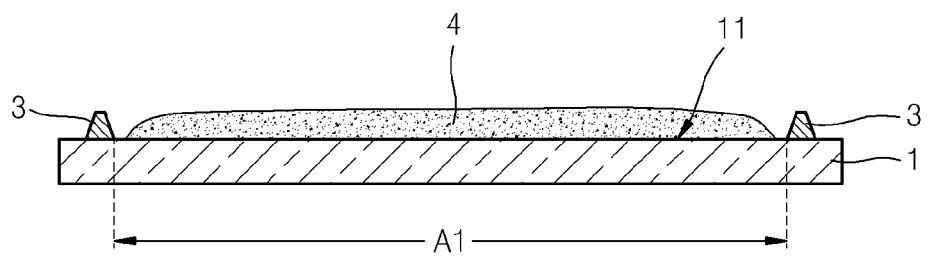
FIG. 2 is a cross-sectional view showing the first substrate coated with the filler in accordance with the operation of FIG. 1.

Since the filler 4 is formed of a material having a high viscosity, the filler 4 does not spread sufficiently enough to contact with the sealing member 3 and may be swollen at the center part of the filler 4 as illustrated in FIG. 2 after being coated on the first surface 11.

Figure 3:
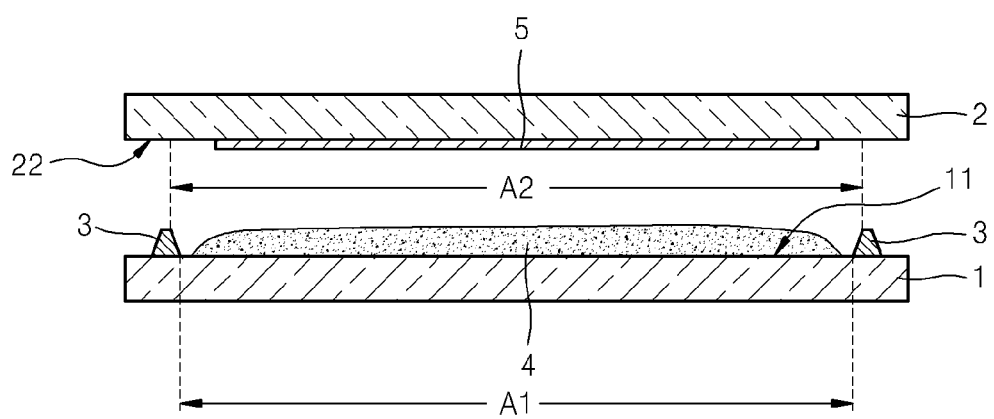
FIG. 3 is a cross-sectional view showing an operation of attaching the first substrate to a second substrate.

In this state, as illustrated in FIG. 3, the second substrate 2 having an organic emission unit 5 formed on one surface 22 of the second substrate 2 is prepared, and the second substrate 2 is bonded with the first substrate 1 by the sealing member 3.

At this time, the organic emission unit 5 disposed on the surface 22 of the second substrate 2 faces toward the one surface 11 of the first substrate 1 and the filler 4, and the organic emission unit 5 is located inside an area A2 of the second substrate 2 with the area A2 corresponding to the scaling member 3.

The organic emission unit 5 may include an organic light emitting device including an anode, an organic thin film layer, and a cathode, and the organic emission unit 5 may further include a thin film transistor for controlling an operation of the organic light emitting device and a capacitor for retaining a signal.

The second substrate 2 may be a glass substrate, however, the present invention is not limited thereto. The second substrate 2 may be a substrate including metal or plastic. In the case of bottom-emission type or both-side emission type light emitting display devices in which light emitted from the organic emission unit 5 propagates toward the second substrate 2, the second substrate 2 may be a transparent glass substrate or a plastic substrate. In the case of front-emission type light emitting display devices in which light emitted from the organic emission unit 5 propagates toward the first substrate 1, the second substrate 2 may be an opaque substrate such as a metal substrate.

A laser beam may be projected onto the sealing member 3 when the first and second substrates 1 and 2 are attached to each other, thereby sealing the first substrate 1 with the second substrate 2 by using the scaling member 3. The laser beam is applied to a case where the scaling member 3 is formed of glass frit. When the sealing member 3 is formed of epoxy, UV or IR is projected onto the sealing member 3 so that the scaling member 3 is hardened.

Figure 4:
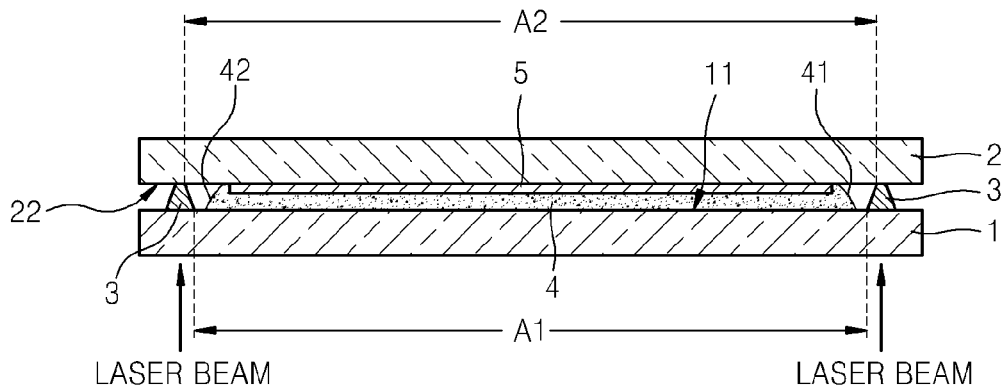
FIG. 4 is a cross-sectional view showing the first and second substrates attached to each other.

As illustrated in FIG. 4, when the first substrate 1 is attached to the second substrate 2, the filler 4 is pressed down by the organic emission unit 5 of the second substrate 2 and the second substrate 2, and thus spreads toward the periphery of the area A1 defined by the scaling member 3. Even in this case, since the viscosity of the filler 4 is high, at least one of a first end 41 and a second end 42 of the filler 4 does not contact the scaling member 3. In some cases where no additional component is disposed between the filler 4 and the scaling member 3, since the viscosity of the filler 4 is high, at least one of a first end 41 and a second end 42 of the filler 4 is not in direct contact with the sealing member 3 after the spreading of the filler 4 as shown in FIG. 4. In some other cases where additional components are disposed between the filler 4 and the sealing member 3, since the viscosity of the filler 4 is high, at least one of a first end 41 and a second end 42 of the filler 4 is not in direct contact with additional components disposed between the filler 4 and the sealing member 3 after the spreading of the filler 4 as shown in FIG. 4.

In the exemplary case of FIG. 4, where no additional component is disposed between the filler 4 and the scaling member 3, the lack of direct contact between at least one of the first and second ends 41 and 42 of the filler 4 and the sealing member 3 represents that the filler 4 has a high viscosity, and in turn the high viscosity of the filler 4 represents that the filler 4 has a high buffering effectiveness. Accordingly, the filler 4 may effectively protect the organic emission unit 5 from external impacts.

When the filler 4 having a high viscosity is coated on the one surface 11 of the first substrate 1, much standby time is required until the filler 4 spreads so sufficiently as to fill the entire space S disposed between the first substrate 1 and the second substrate 2.

To reduce the standby time and to manufacture an organic light emitting display device within a shorter period of time, the filler 4 is spread toward the scaling member 3 by using a centrifugal force F so that all of the first and second ends 41 and 42 of the filler 4 may in direct contact with the sealing member 3. The periphery of filler 4 is pulled outwardly by the centrifugal force F and the filler 4 spreads toward the scaling member 3.

To spread the filler 4 by using the centrifugal force F, the assembly of the first substrate 1 and the second substrate 2 may be vibrated in a surface direction SP of the first substrate 1. The surface direction SP is a direction parallel to the first substrate 1. In one embodiment, the assembly of the first substrate 1 and the second substrate 2 may be spun along an axis substantially perpendicular to the first substrate in more detail, as illustrated in FIG. 5, the filler 4 may be spread by the centrifugal force F by spinning the assembly of the first substrate 1 and the second substrate 2 along the axis AXIS.

Figure 5:
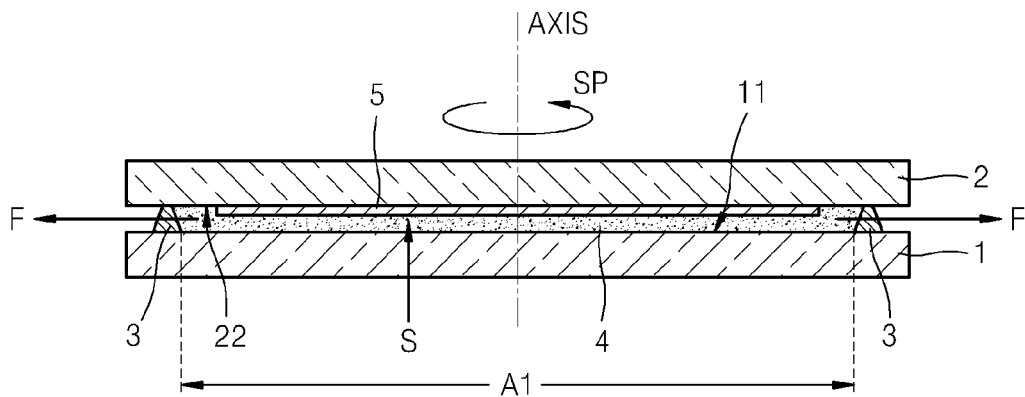
FIG. 5 is a cross-sectional view showing an operation of spinning an assembly of the first and second substrates.

By spinning the assembly of the first and second substrates 1 and 2 in the way as shown in FIG. 5, the filler 4 may be spread over the entire space S disposed between the first and second substrates 1 and 2 within a shorter period of time.

Figure 6:
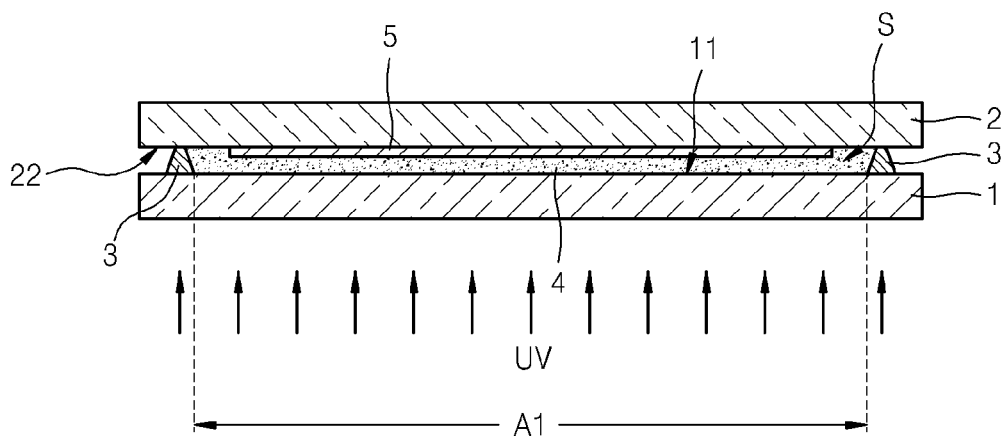
FIG. 6 is a cross-sectional view showing an operation of hardening the filler.

After the filling of the filler 4 is completed, as illustrated in FIG. 6, UV is radiated onto the filler 4 to harden the filler 4 filled.

Figure 7:
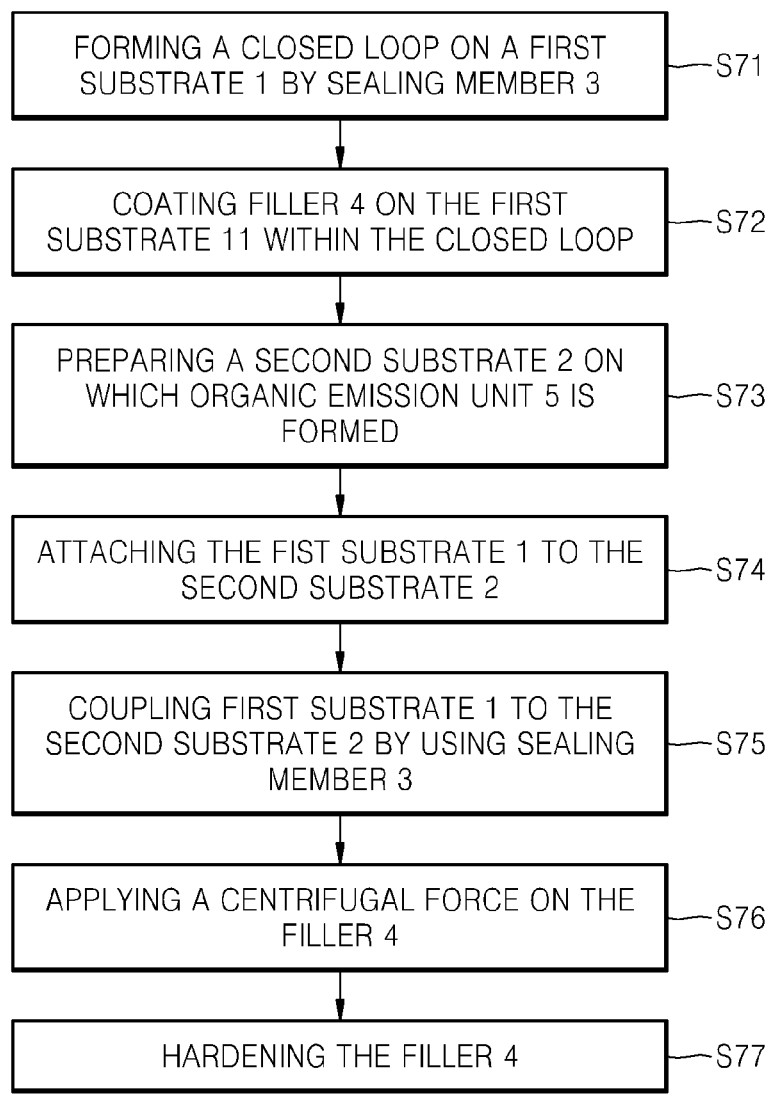
FIG. 7 is a flow chart showing a manufacturing process making an organic light emitting display device.

In one embodiment as shown in FIG. 7, the manufacturing process of making am organic light emitting display device may include the following seven steps: forming at least one closed loop on the first surface 11 of a first substrate 1 by using the sealing member 3 (S71); coating the filler 4 on the area A1 defined by the closed loop with at least a portion of the periphery of the filler 4 being spaced apart from the sealing member 3 (S72); preparing the second substrate 2 on which at least one organic emission unit 5 is formed, and each of organic emission unit 5 corresponding to one closed loop (S73); disposing the second substrate 2 opposite to and spaced apart from the first substrate 1, and the organic emission unit 5 facing toward the first surface 11 of the first substrate 1 (S74); preparing an assembly of the first substrate 1 and the second substrate 2 by coupling the first substrate 1 to the second substrate 2 with the scaling member 3 (S75); applying a centrifugal force F on the filler along a radial direction of the filler 4 and allowing an entire periphery of the filler being in direct contact with the sealing member 3 (S76); and hardening the filler 4 (S77).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light emitting display device, the method comprising steps of:
    forming at least one closed loop on a first surface of a first substrate by using a sealing member;
    coating an area defined by the closed loop on the first surface of the first substrate with a filler so that at least a part of an end portion of the coated filler does not contact the sealing member;
    preparing a second substrate comprising at least one organic emission unit formed on a second surface of the second substrate;
    disposing the second substrate opposite to the first substrate so that the organic emission unit faces the first surface of the first substrate;
    after the coating of the filler, coupling the first substrate with the second substrate by using the sealing member; and
    after the coupling of the first and second substrates, allowing an entire end portion of the filler to contact the sealing member, by using a centrifugal force,
    wherein the step of allowing of the entire end portion of the filler to contact the sealing member comprises a step of vibrating an assembly of the first and second substrates in a surface direction of the first substrate, and
    wherein the vibration of the assembly of the first and second substrates comprises a step of spinning the assembly of the first and second substrates.

2. The method of claim 1, wherein the step of allowing of the entire end portion of the filler to contact the sealing member comprises allowing the filler to contact the organic emission unit and the second surface of the second substrate.

3. The method of claim 1, wherein, after the step of allowing of the entire end portion of the filler to contact the sealing member, a step of hardening the filler is performed.

4. The method of claim 3, wherein the step of hardening of the filler comprises a step of projecting ultraviolet rays onto the filler.

5. The method of claim 1, wherein the sealing member is an inorganic material.

6. The method of claim 5, wherein the inorganic material comprises glass frit.

7. A method of manufacturing an organic light emitting display device, the method comprising steps of:
    forming at least one closed loop on a first surface of a first substrate by using a sealing member;
    coating a filler on an area defined by the closed loop with at least a portion of a periphery of the filler coated being spaced apart from the sealing member;
    preparing a second substrate comprising at least one organic emission unit formed on a second surface of the second substrate, and one organic emission unit corresponding to one closed loop;
    disposing the second substrate opposite to and spaced apart from the first substrate, and the organic emission unit facing toward the first surface of the first substrate;
    after the coating of the filler, preparing an assembly of the first substrate and the second substrate by coupling the first substrate to the second substrate with the sealing member; and
    after the coupling of the first and second substrates, allowing an entire periphery of the filler being in direct contact with the sealing member by applying a centrifugal force on the filler along a radial direction of the filler,
    wherein the step of allowing of the entire periphery of the filler being in direct contact with the sealing member comprises a step of vibrating the assembly of the first and second substrates in a direction parallel to the first surface of the first substrate, and
    wherein the vibration of the assembly of the first and second substrates comprises a step of spinning the assembly of the first and second substrates.

8. The method of claim 7, wherein the step of allowing of the entire periphery of the filler being in direct contact with the sealing member comprises a step of allowing the filler being in direct contact with both of the organic emission unit and the second surface of the second substrate.

9. The method of claim 7, wherein a step of hardening the filler is performed after the step of allowing of the entire periphery of the filler being in direct contact with the sealing member.

10. The method of claim 9, wherein the step of hardening of the filler comprises a step of projecting ultraviolet rays onto the filler.

11. The method of claim 7, wherein the sealing member is an inorganic material.

12. The method of claim 11, wherein the inorganic material comprises glass frit.

* * * * *